US010707845B2

(12) United States Patent
Hunt-Schroeder et al.

(10) Patent No.: US 10,707,845 B2
(45) Date of Patent: Jul. 7, 2020

(54) ULTRA-LOW VOLTAGE LEVEL SHIFTER

(71) Applicant: MARVELL INTERNATIONAL LTD., Hamilton (BM)

(72) Inventors: Eric D. Hunt-Schroeder, Essex Junction, VT (US); John A. Fifield, Burlington, VT (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/189,407

(22) Filed: Nov. 13, 2018

(65) Prior Publication Data
US 2020/0153418 A1 May 14, 2020

(51) Int. Cl.
*H03K 19/00* (2006.01)
*H03K 3/037* (2006.01)

(52) U.S. Cl.
CPC .................... *H03K 3/037* (2013.01)

(58) Field of Classification Search
USPC ........................................... 327/333
See application file for complete search history.

(56) References Cited

U.S. PATENT DOCUMENTS

| 5,751,179 | A | * | 5/1998 | Pietruszynski | ....... | H01L 27/088 257/E27.06 |
| 6,480,050 | B1 | | 11/2002 | Barnes | | |
| 7,053,656 | B2 | * | 5/2006 | Seo | .................. | H03K 19/01852 326/68 |
| 7,659,766 | B2 | * | 2/2010 | Ishida | ..................... | G05F 3/262 327/333 |
| 7,795,916 | B2 | * | 9/2010 | Aoki | .................. | H03K 3/35613 326/63 |
| 8,058,137 | B1 | * | 11/2011 | Or-Bach | .............. | H03K 17/687 257/E21.023 |
| 8,436,661 | B2 | * | 5/2013 | Lee | ......................... | H03K 5/082 327/108 |
| 8,653,877 | B2 | | 2/2014 | Wu et al. | | |
| 9,502,410 | B1 | * | 11/2016 | Feng | .................... | H01L 27/0886 |
| 9,530,851 | B1 | * | 12/2016 | Lu | ......................... | H01L 27/088 |
| 9,647,645 | B1 | | 5/2017 | Schaffer et al. | | |
| 2004/0160258 | A1 | * | 8/2004 | Tobita | ................... | G09G 3/3688 327/333 |
| 2005/0237099 | A1 | * | 10/2005 | Tachibana | ........ | H03K 3/356113 327/333 |
| 2006/0164148 | A1 | * | 7/2006 | Davis | .................. | H03K 19/0016 327/333 |
| 2007/0046357 | A1 | * | 3/2007 | Shimizu | ................. | H03K 3/012 327/333 |
| 2008/0061856 | A1 | * | 3/2008 | Byeon | .................... | G05F 1/465 327/333 |
| 2008/0187089 | A1 | * | 8/2008 | Miyayama | ............. | G11C 19/28 377/79 |
| 2010/0066420 | A1 | * | 3/2010 | Kaneko | ................. | H03L 7/0896 327/157 |

(Continued)

*Primary Examiner* — Adam D Houston

(57) ABSTRACT

The present disclosure relates to a structure which includes a voltage level shifter circuit which includes a first current mirror leg circuit and a second current mirror leg circuit, the first current mirror leg circuit receives an input signal on a low voltage power supply and level shifts the input signal to a high voltage power supply which is at a greater voltage than the low voltage power supply, and the high voltage power supply is output from the second current mirror leg circuit.

21 Claims, 3 Drawing Sheets

(56) References Cited

U.S. PATENT DOCUMENTS

| | | | | |
|---|---|---|---|---|
| 2011/0025397 A1* | 2/2011 | Wang | ............ | H03K 19/018521 327/333 |
| 2011/0068759 A1* | 3/2011 | Kuo | ............ | H02M 3/156 323/282 |
| 2011/0316604 A1* | 12/2011 | Em | ............ | G11C 7/1078 327/333 |
| 2012/0086696 A1* | 4/2012 | Sugiyama | ............ | H03K 19/018521 345/212 |
| 2013/0181762 A1* | 7/2013 | Wu | ............ | H03K 3/35613 327/333 |
| 2013/0257505 A1* | 10/2013 | Chiang | ............ | H03L 5/00 327/333 |
| 2014/0320168 A1* | 10/2014 | Luo | ............ | H03K 19/0013 326/80 |
| 2015/0130428 A1* | 5/2015 | Lee | ............ | H03K 19/0013 323/271 |
| 2015/0130528 A1* | 5/2015 | Agrawal | ............ | H03K 19/0185 327/333 |
| 2015/0171838 A1* | 6/2015 | Tsai | ............ | H03K 3/0315 331/57 |
| 2015/0288365 A1* | 10/2015 | Lai | ............ | H02M 1/14 327/333 |
| 2015/0341034 A1* | 11/2015 | Varkony | ............ | H03K 19/018507 327/333 |
| 2016/0020758 A1* | 1/2016 | Kim | ............ | H03K 5/134 327/103 |
| 2016/0094225 A1* | 3/2016 | Lim | ............ | H03K 19/017509 345/174 |
| 2016/0105163 A1* | 4/2016 | Chen | ............ | H03K 3/356165 327/333 |
| 2016/0191027 A1* | 6/2016 | Qiu | ............ | H03K 3/356113 327/333 |
| 2016/0204770 A1* | 7/2016 | Lee | ............ | H03K 19/0013 327/333 |
| 2017/0178970 A1* | 6/2017 | Anderson | ............ | H01L 29/4966 |
| 2017/0261828 A1* | 9/2017 | Noma | ............ | G02F 1/1368 |
| 2018/0158737 A1* | 6/2018 | Kim | ............ | H01L 29/78 |
| 2018/0350802 A1* | 12/2018 | Lee | ............ | H01L 21/823431 |

* cited by examiner

ULTRA-LOW VOLTAGE LEVEL SHIFTER

FIELD OF THE INVENTION

The present disclosure relates to a semiconductor device, and more particularly, to an ultra-low voltage level shifter and a method for translating a lower voltage to a higher voltage.

BACKGROUND

Memory designs often require two or more power supplies on a chip. One of the power supplies can be a low voltage which is used for reducing chip power consumption in the control and input/output (I/O) logic. A second voltage power supply can be a high voltage which is used for performance in a memory array core (e.g., used for fast writing/reading operations or separate functionality operations). The location at which a lower voltage meets with a higher voltage on a chip requires a level translation from the lower voltage to the higher voltage for the logic to function properly.

Existing level translators (i.e., level shifters) work well with voltage supplies which are close together in voltage values (i.e., a high voltage value is up to two times a value of a low voltage value). However, in newer memory technologies (i.e., 7 nanometers or less), periphery logic must be run at a very low voltage level to reduce power consumption of circuits that are not performance critical. In an example use case, a wordline voltage in a memory may need to be level shifted from a first lower voltage power supply to a second higher voltage power supply during a write or read operation.

SUMMARY

In an aspect of the disclosure, a structure includes a voltage level shifter circuit which includes a first current mirror leg circuit and a second current mirror leg circuit, wherein the first current mirror leg circuit receives an input signal on a low voltage power supply and level shifts the input signal to a high voltage power supply which is at a greater voltage than the low voltage power supply, and the high voltage power supply is output from the second current mirror leg circuit.

In another aspect of the disclosure, a circuit includes a first current mirror leg circuit comprising a first NOR gate and a first dual gate, thick oxide, high voltage (EG) transistor, and a second current mirror leg circuit comprising a second NOR gate and a second dual gate, thick oxide, high voltage (EG) transistor.

In another aspect of the disclosure, a method includes receiving an input signal, a bias signal, a bias voltage generator output signal, an inverted input signal, and an inverted enable signal at a voltage level shifter circuit which includes a first current mirror leg circuit and a second current mirror leg circuit, and level shifting the input signal to a higher voltage than the input signal by using a differential current between the first current mirror leg circuit and the second current mirror leg circuit. The higher voltage is a multiple voltage value of the input signal.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
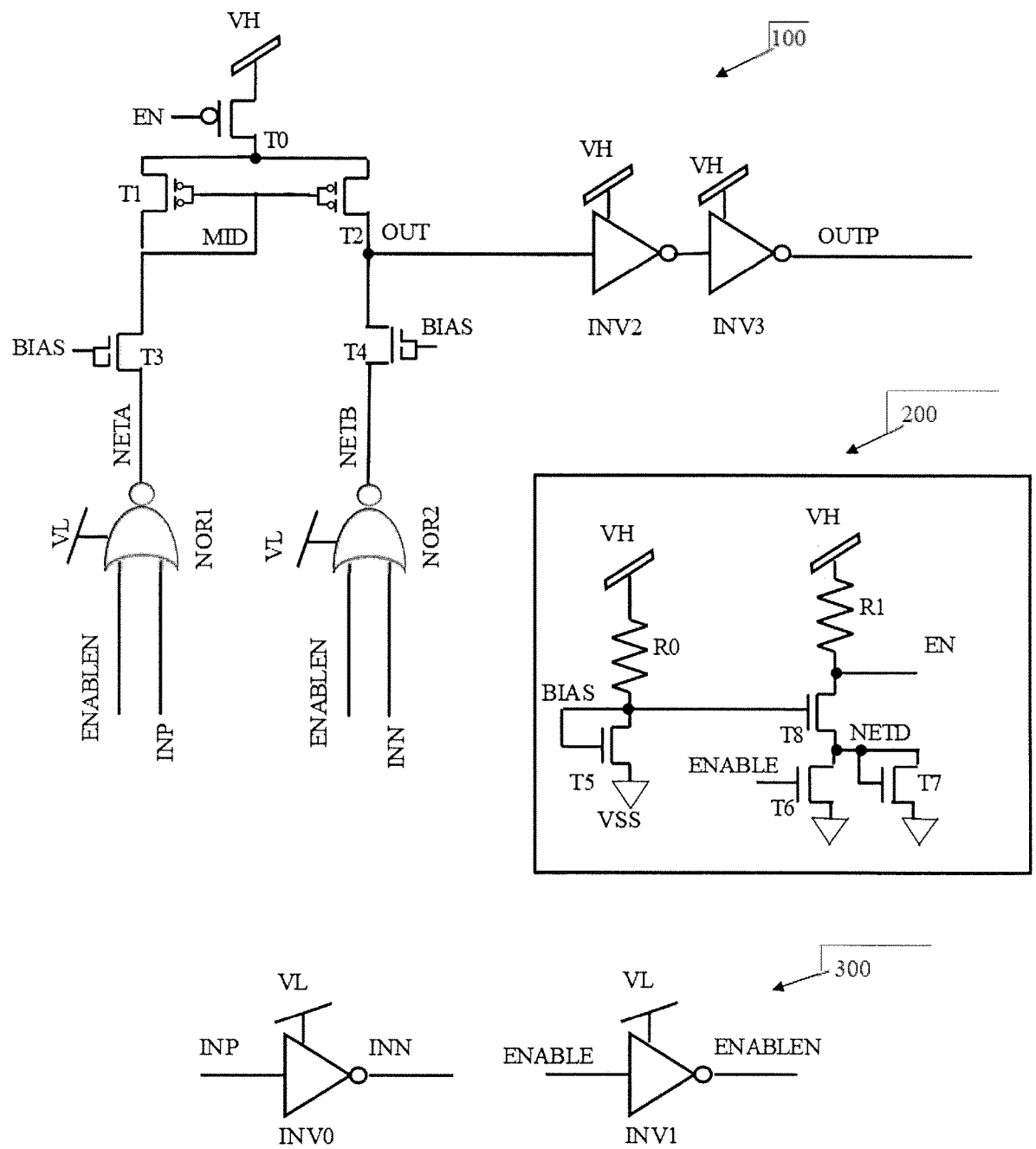
FIG. 1 shows an ultra-low voltage level shifter circuit in accordance with aspects of the present disclosure.

The present disclosure relates to a semiconductor device, and more particularly, to an ultra-low voltage level shifter circuit and a method for translating a lower voltage to a higher voltage. In more specific embodiments, the present disclosure is an improved ultra-low voltage level shifter which functions over a large range of temperatures, consumes near zero power when inactive and operates with high statistical confidence. Advantageously, the circuit can also translate a low voltage to a higher voltage which is several multiples of the lower voltage, has an off state with a zero volt output regardless of the input, allows for the input voltage to be below the threshold of the dual gate, thick oxide (EG) transistor, and allows for the output voltage to be above the reliability limit of the single gate, thin oxide (SG) transistor.

In embodiments, in complex low nanometer memory technology (i.e., 7 nm or less), periphery logic can be run at an absolute lowest voltage possible to reduce power consumption of circuits that do not require critical performance. In complex low nanometer memory technology, a lower voltage may be slightly above a worst case threshold voltage of a single gate, thin oxide, low voltage (i.e., SG) transistor, such as 400 mV, and may be below the threshold voltage of a dual gate, thick oxide, high voltage (i.e., EG) transistor such that the low voltage will not turn on the worst case (i.e., +5 sigma) EG transistor. Further, the desired higher voltage can be translated up to several multipliers (e.g., 1×, 2×, 3×, 4×, 5×, . . . ) of the lower voltage. In conventional technologies, the higher voltage exceeds the reliability limits of the single gate, thin oxide, low voltage (i.e., SG) transistor. Hence, to solve this issue, the circuit described herein includes a mixture of EG and SG transistors or protection devices that can be used to carefully restrict the absolute terminal-terminal voltages of all transistors used in the level translator. Further, the level translator in the present disclosure is designed with adequate functionality, area, power, and speed.

In embodiments, the level translator described herein can translate a lower voltage (e.g., less than 400 millivolts (mV) to 1.0 volt) to a higher voltage (e.g., more than 1.6 volts). In embodiments, the level translator can translate a lower voltage up to a higher voltage that may be multiples (i.e., 1×, 2×, . . . , 5×, etc.) of the lower voltage. Further, the level translator can function from about −55° C. to about 125° C. at circuit (junction temperature) and can consume near zero power when inactive (i.e., only negligible leakage currents existing from off devices). In embodiments, the level translator has an off state (i.e., the ENABLE signal=0 volts) in which the output is 0 volts regardless of the state of the input (i.e., INP) signal. The level translator does not exceed a SG reliability limit of 1.0 volt across any terminals and can operate with a statistical confidence (i.e., statistical confidence based on a Monte Carlo analysis at global process corners). Lastly, the input voltage can be below the threshold voltage of the dual gate, thick oxide, high voltage (i.e., EG) transistor and the output voltage can be above the reliability limit of the single, gate thin oxide, low voltage (i.e., SG) transistor.

FIG. 1 shows an ultra-low voltage level shifter circuit in accordance with aspects of the present disclosure. The voltage level shifter circuit 100 includes a transistor T0 connected to a transistor T1, a transistor T2, a high voltage power supply VH, and gated with a signal EN. The transistor T0 is an EG header device which is connected to a high voltage power supply VH and the source of transistors T1 and T2. Further, the drain of transistor T1 is connected to the MID signal and the drain of transistor T2 is connected to the OUT signal. In embodiments, transistors T0, T1, and T2 are PMOS devices, although embodiments are not limited to PMOS devices.

Further, the transistor T1 is serially connected to transistor T3 and includes a gate connected to a MID signal. The transistor T2 is serially connected to transistor T4 and includes a gate connected to the MID signal. In embodiments, transistor T1 forms a first current mirror leg and transistor T2 forms a second current mirror leg which are used to sense the differential current from transistors T3 and T4, respectively.

Transistors T3 and T4 have gates which are connected to the BIAS signal to pull equal currents unless an imbalance occurs. Further, the drain of transistor T3 is connected to the MID signal and the source is connected to the NETA signal. The drain of transistor T4 is connected to the OUT signal and the source is connected to the NETB signal. In embodiments, the transistors T3 and T4 are NMOS devices, although embodiments are not limited to NMOS devices. In embodiments, the overdrive on the transistors T3, T4 through the first and second current mirror legs forces a current imbalance which can be sensed and used for a level translation.

Still referring to FIG. 1, the transistor T3 is serially connected to a NOR1 gate and gated with a BIAS signal. Similarly, the transistor T4 is serially connected to a NOR2 gate and also gated with the BIAS signal.

The NOR1 gate is connected to a low voltage power supply VL, receives the ENABLEN signal, the INP input signal, and outputs a NETA signal. The NOR2 gate is connected to the low voltage power supply VL, receives the ENABLEN signal, the INN input signal, and outputs a NETB signal. The NOR gates NOR1, NOR2 are powered by the low voltage power supply VL and can cause a current imbalance based on the input signals INN and INP when the ENABLE signal is 1 and the ENABLEN is 0 volts. Depending on the value of the INP input signal, the NETA, NETB signals will be connected to the low voltage power supply VL or the voltage power supply VSS (i.e., 0 volts). Further, although FIG. 1 shows NOR gates NOR1, NOR2, embodiments are not limited and Boolean equivalent logic gates can be used instead of NOR gates NOR1, NOR2.

An inverter INV2 receives an input of an OUT signal, is connected to the high voltage power supply VH, and outputs a signal to an inverter INV3. The inverter INV3 is connected to the high voltage power supply VH and outputs an OUTP signal. In the voltage level shifter circuit 100, transistors T0, T1, T2, T3, T4 and inverters INV2, INV3 are built using EG transistors (which can handle voltages greater than 1 volt) and the NOR gates NOR1, NOR2, INV0, INV1 are single gate, thin oxide devices (which can handle voltages less than 1 volt). Further, the inverters INV2 and INV3 are powered by the high voltage power supply VH to buffer the OUT signal.

FIG. 1 further shows a bias voltage generator and enable circuitry 200 which includes a transistor T5 connected to a resistor R0 and gated with a BIAS signal. Further, a transistor T8 is connected to resistor R1 and transistor T6 and gated with the BIAS signal. The transistor T6 is gated with an ENABLE signal and connected to a transistor T7. The transistor T7 is gated with a NETD signal. The resistors R0 and R1 are also connected to the high voltage power supply VH. The EN signal is connected between the resistor R1 and the transistor T8. In embodiments, the transistors T5, T6, T7 and T8 are NMOS devices, although embodiments are not limited to NMOS devices. The transistors T5 and T8 are EG transistors and transistors T6 and T7 are SG transistors. Transistor T7 is a diode configured NMOS device used to prevent NETD from going above a 1.0V reliability limit of the SG transistor. Further, the bias voltage generator and enable circuitry 200 (i.e., one per chip) includes resistor R0 and transistor T5 to generate the BIAS signal and resistor R1 and transistors T6, T7, and T8 to generate the EN signal.

In FIG. 1, a bias voltage generator can create the voltage BIAS signal. However, it should be understood by those of skill in the art that the bias voltage generator and enable circuitry 200 are non-limiting examples, with other implementations (i.e., a bandgap voltage reference circuit) contemplated herein. Further, the BIAS signal in the bias voltage generator and enable circuitry 200 is created from the transistor T5 (i.e., diode configured EG transistor) and the resistor R0. Further, the BIAS signal connects to the transistor T8 (i.e., EG transistor) as a protection device.

In conventional circuitry, a differential current amplifier is used in which a current through two legs (i.e., leg 1 through transistor T3 of FIG. 1 and leg 2 through transistor T4 of FIG. 1) is equal. In contrast, the embodiments of the present disclosure includes a circuit in the voltage level shifter circuit 100 to add a power save mode (i.e., transistor T0) and cause a differential current imbalance to occur through leg 1 and leg 2 with NOR1 and NOR2, respectively. In embodiments, operability is shown from about 350 millivolts to about 1.0 volt across process, voltage, and temperature. Further, the embodiments also allow for a power save mode.

In the operation of the bias voltage generator and enable circuitry 200, when the ENABLE signal is set to 0, the transistor T6 (i.e., SG transistors) is turned off, which eliminates a path to ground. The transistor T7 is then used in a diode configuration as a protection device which will prevent NETD from going above a safe limit. Then, the EN signal will rise up to the high voltage power supply VH through the resistor R1 turning off the transistor T0 in the voltage level shifter circuit 100. The transistor T7 is another protection device (i.e., a secondary device) which prevents the NETD signal from getting to an unsafe level when the ENABLE signal is 1 or 0.

In another operation of the bias voltage generator and enable circuitry 200, when the ENABLE signal is 1, the EN signal will be pulled down enough to turn on the transistor T0 (i.e., header transistor T0) in the voltage level shifter circuit 100 and enables the voltage level shifter circuit 100 (i.e., the EN signal is below the voltage threshold of transistor T0 when the ENABLE signal is 1).

In FIG. 1, assuming the ENABLE signal, which is powered by a low voltage power supply VL, is high (i.e., the ENABLE signal=1=the low voltage power supply), the transistor T6 is turned on and will pull the NETD signal to ground. The high voltage power supply VH is powered to about 2.0 volts, which generates a voltage BIAS signal of about 700 millivolts. The transistor T8 is turned on because the BIAS signal is about 700 millivolts and the EN signal will be pulled sufficiently low below the high voltage power supply VH to turn on transistor T0 and enable the voltage level shifter circuit 100 to shift from the low voltage power supply VL to the high voltage power supply VH.

In FIG. 1, an inverter circuit 300 includes an inverter INV0 which receives INP as an input, is connected to the low voltage power supply VL, and outputs the INN signal. Further, the inverter circuit 300 includes an inverter INV1 which receives the ENABLE signal, is also connected to the low voltage power supply VL, and outputs the ENABLEN signal. In the inverter circuit 300, both inverters INV0 and INV1 are single gate, thin oxide inverters.

In FIG. 1, the low voltage power supply VL and the high voltage power supply VH are the two power supplies in FIG. 1. In an example of FIG. 1, the low voltage power supply VL can range from about 350 millivolts to about 1.0 volt, although embodiments are not limited to these ranges. On the other hand, the high voltage power supply VH can range from about 350 millivolts to about 2.0 volts, although embodiments are not limited to these ranges. The ranges described above for the low voltage power supply VL and the high voltage power supply VH can be used in test, functional write/read, and/or characterization applications.

In FIG. 1, SG transistors can have a maximum terminal-terminal (i.e., gate-source, gate-drain, drain-source) voltage of about 1.0 volt for certain memory technologies (e.g., 7 nm, 14 nm, etc.). The EG transistors are used when voltages exceed the thin oxide limits of 1.0 volt, as the EG transistors are manufactured specifically to withstand the higher voltages (e.g., 1.2 volts, 1.5 volts, 1.8 volts, 2.0 volts, and 2.5 volts terminal-terminal). SG transistors have threshold voltages which range from about 200 millivolts to about 350 millivolts; whereas, the EG transistors have threshold voltages range from about 300 millivolts to about 500 millivolts. These threshold voltages can be dependent on process and temperature.

In FIG. 1, two input signals come in on the low voltage power supply VL: the input INP signal and the ENABLE signal. The INP signal goes from the low voltage power supply VL to the high voltage power supply VH. The ENABLE signal is the signal used to enter a low power mode when not being used (i.e., when the level shifter is turned off). The OUTP signal is an output signal which has a same polarity as the input signal INP when the level shifter is enabled (i.e., active), and at the high voltage power supply VH when required for higher voltage applications.

In embodiments, when the NETA and NETB signals are both connected to ground, the configuration of transistors that remain (i.e., transistors T0, T1, T2, T3, and T4) will be at a steady state. For example, the EG NMOS FETs whose gates are connected to the BIAS signal (i.e., transistors T3 and T4) will pull equal currents through the two current mirror legs (i.e., the first and second current mirror legs) of the voltage level shifter circuit 100, and under ideal conditions, the voltage MID signal would be very close to the voltage OUT signal. Therefore, the voltage level shifter circuit 100 would be a balanced amplifier (i.e., the current through the transistor T3 would be approximately equal to the current through the transistor T4). Further, by incorporating the NETB and NETB signals, a current imbalance can occur in the voltage level shifter circuit 100 (i.e., the amplifier) based on the logic state of the input signal INP.

In operation, when the input signal INP is equal to the low voltage power supply VL (e.g., >=350 millivolts) and the ENABLE signal is equal to the low voltage power supply VL (e.g., >=350 millivolts), then the input signal INN (which is the output of the inverter INV0) will be 0 volts. In this scenario, the output of the NOR gate NOR1 (i.e., the NETA signal) will be forced to 0 volts. Since the voltage of the BIAS signal is about 700 millivolts and the threshold voltage of the EG transistor is >about 350 millivolts, the transistor T3 will be strengthened (i.e., higher gate-source voltage), which increases the current from the balanced state. In other words, the current through the transistor T3 will be increased.

In operation, the output of the NOR gate NOR2 (i.e., the NETB signal) will be connected to the low voltage power supply VL assuming the same inputs on INP and ENABLE mentioned above. Since the voltage of the BIAS signal is about 700 millivolts and the threshold voltage of the EG transistor is >about 350 millivolts, the transistor T4 will be cut off or weakened (i.e., low/less gate-source voltage), which reduces the current from the balanced state. In other words, the current through the transistor T4 will be decreased.

The MID signal will try to adjust to compensate the differential current imbalance and move down towards the voltage power supply VSS (i.e., 0V). As the voltage of the MID signal self adjusts to a lower voltage, the transistors T1 and T2 are strengthened. Further, with the transistor T3 strongly turned on, due to the gate at the BIAS signal and the source at about 0 volts from the NETA signal being 0 volts and from the transistor T4 being weakened or cut off from the NETB signal being equal with the low voltage power supply VL (i.e., about 350 millivolts) when the BIAS signal is about 700 millivolts, the OUT signal will pull up to the high voltage power supply VH (i.e., about 2 volts). The OUT signal will then be inverted through inverters INV2, INV3 and the OUTP signal will be equal to the high voltage power supply VH. In other words, when the input signal INP is equal to the low voltage power supply VL, the OUTP signal will be the high voltage power supply VH.

In operation, when the input signal INP is equal to 0 volts, then the input signal INN, which is the output of the inverter INV0, will be connected to the low voltage power supply VL (i.e., >=350 millivolts) and the ENABLE signal is equal to the low voltage power supply VL. In turn, the output of the NOR gate NOR1 (i.e., the NETA signal) will be connected to the low voltage power supply VL. As the voltage of the BIAS signal is approximately 700 millivolts and the threshold voltage of the EG transistor is less than 350 millivolts, the transistor T3 will be cut off or weakened (i.e., less gate-source voltage), reducing the current from the balanced state. Therefore, the current through the transistor T3 will be decreased.

In operation, the output of the NOR gate NOR2 (i.e., the NETB signal), will be connected to 0 volts. As the bias voltage is about 700 millivolts and the threshold voltage of the EG transistor is less than 350 millivolts, the transistor T4 will be strengthened (i.e., higher gate-source voltage), increasing the current from the balanced state. Therefore, the current through the transistor T4 will be increased.

In operation, the MID signal will adjust to try to compensate the differential current imbalance and move up towards the high voltage power supply VH. In embodiments, when the transistor T3 is cut off or sufficiently weakened, the MID signal will reach the high voltage power supply VH, cutting off the transistors T1 and T2. With the transistor T4 strongly turned on, due to the gate at the BIAS signal and source at about 0 volts from the NETB signal being 0 volts, the OUT signal will pull down to 0 volts. The OUT signal is inverted through inverters INV2 and INV3 and the OUTP signal will be 0 volts. In other words, when the input signal INP is equal to 0 volts, the OUTP signal will be 0 volts.

The voltage level shifter circuit 100 can also have a power save mode/operation.

In the power save mode/operation, the ENABLE signal goes to 0 (i.e., 0 volts from the NETA and NETB signals being 0 volts from NOR gates NOR1, NOR2). Further, when the ENABLE signal goes to 0, transistor T6 is turned off, which causes the EN signal to rise up to the high voltage power supply VH through resistor R1 as the path to VSS (i.e. 0V) has been removed when T6 is turned off. With the EN signal at the high voltage power supply VH, the transistor T0 is turned off. Thus, the voltage level shifter circuit 100 (i.e., amplifier) has disconnected the path to the high voltage power supply VH. In other words, the MID and OUT signals can only be pulled down to through transistors T3, T4 by NOR gates NOR1, NOR2.

In the power save mode/operation, since the voltage threshold of the EG transistors T3, T4 is less than 350 millivolts and the voltage of the BIAS signal is about 700 millivolts, when the low voltage power supply VL is 0 volts, the transistors T3, T4 (i.e., EG transistors) will connect the MID and the OUT signals to 0 volts and consume no current. In this scenario, no current will be consumed because the drain and source are at 0 volts. In other words, when the voltage level shifter circuit 100 (i.e., the level shifter) is disabled, the output is 0 volts and zero power is consumed (i.e., only leakage current exists).

Figure 2:
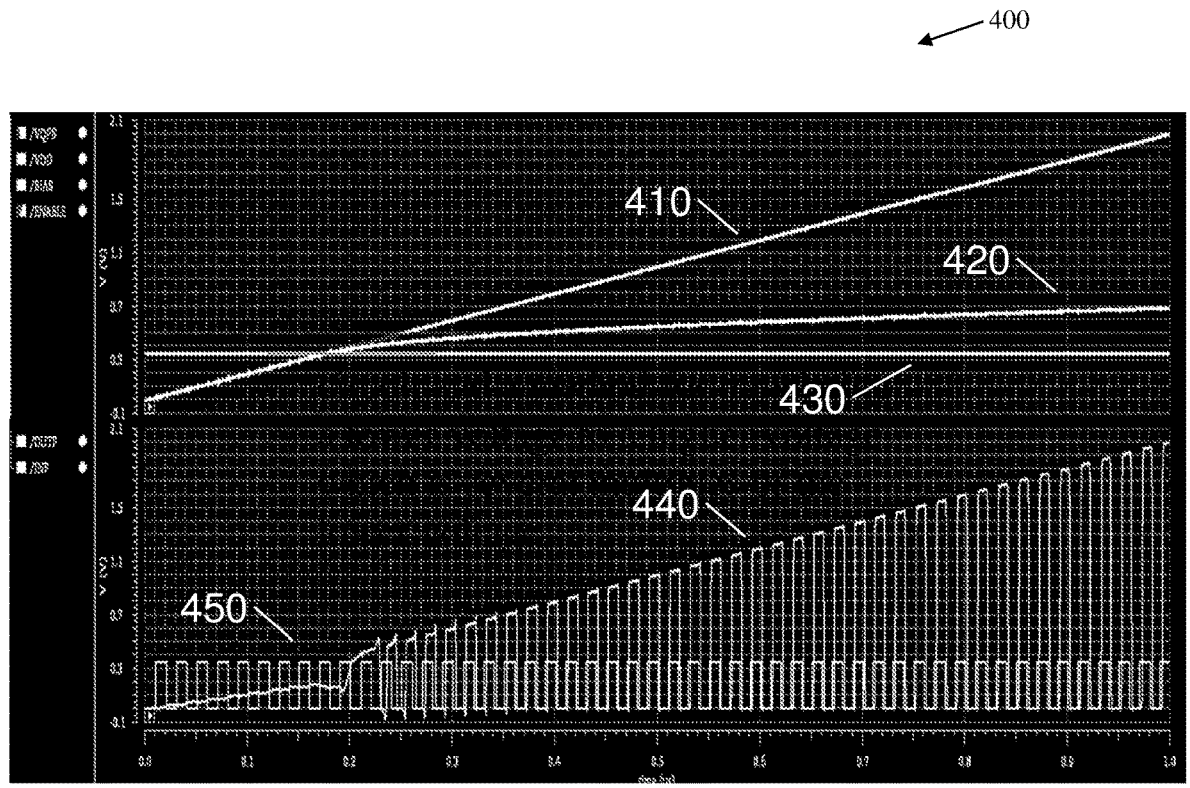
FIG. 2 shows a performance graph of the ultra-low voltage level shifter circuit in accordance with aspects of the present disclosure.

FIG. 2 shows a performance graph of the ultra-low voltage level shifter circuit in accordance with aspects of the present disclosure. In graph 400 of the voltage level shifter circuit 100, the VDD signal 430 is the low voltage power supply VL and the VQPS signal 410 is the high voltage power supply VH. As shown in the graph 400, the voltage level shifter circuit 100 is functional when the VQPS signal 410 (i.e., the high voltage power supply VH) and the voltage of the BIAS signal 420 exceeds the threshold voltage of the EG transistors. This occurs even when the VDD signal 430 (i.e., low voltage power supply VL), which is about 0.35 volts, is less than the threshold voltage of the EG transistors. Further, when the VQPS signal 410 (i.e., the high voltage power supply VH) and the voltage of the BIAS signal 420 is below the threshold of the EG transistors, the voltage level shifter circuit 100 is not functional. FIG. 2 also shows the output OUTP signal 440 and the input signal INP 450.

Figure 3:
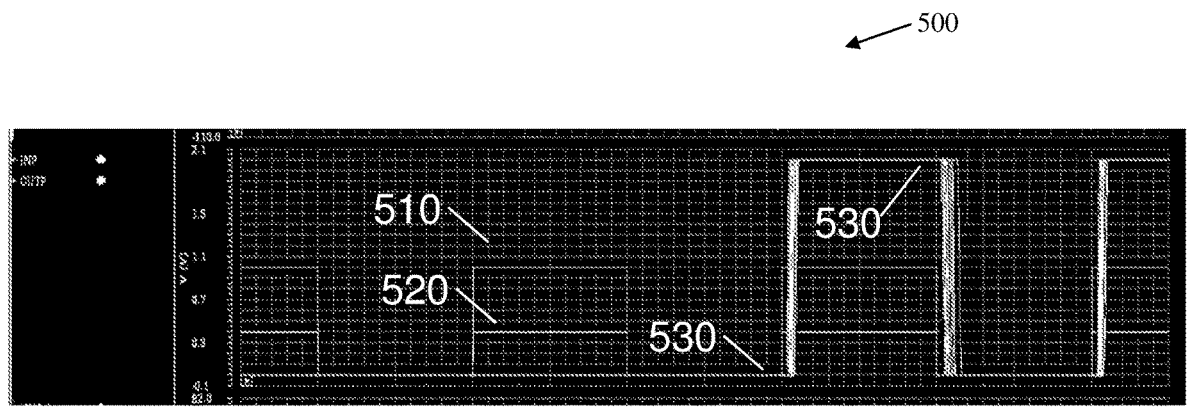
FIG. 3 shows another performance graph of the ultra-low voltage level shifter circuit in accordance with aspects of the present disclosure.

FIG. 3 shows another performance graph of the ultra-low voltage level shifter circuit in accordance with aspects of the present disclosure. On the left side of the graph 500 of the voltage level shifter circuit 100, the ENABLE signal is 0, i.e. the first two cycles where the INP 510, 520 signal is a logical "1." In this scenario, the value of the INP signals 510, 520 are ignored. Thus, the OUTP signal 530 is a known value of 0V. In contrast, on the right side of the graph 500 of the voltage level shifter circuit 100, the ENABLE signal is a value of the low voltage power supply VL, i.e., the second two cycles where the INP 510, 520 signal is a logical "1." In this situation, the INP signal is level shifted (from the INP signal 520 at 0.4 volts) to the high voltage power supply VH (i.e., the INP signal 510 at 1.0 volts). Thus, when the ENABLE signal is triggered in the graph 500, the input INP signal (e.g., 0.4 volts) is level shifted to the high voltage power supply VH (e.g., 1.0 volts). Further, the OUTP signal 530 follows the input INP signals 510, 520.

The circuit and the method for translating a lower voltage to a higher voltage which is several multiples of the lower voltage of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for translating a lower voltage to a higher voltage which is several multiples of the lower voltage of the present disclosure has been adopted from integrated circuit (IC) technology. For example, the structures are built on wafers and are realized in films of material patterned by photolithographic processes on the top of a wafer. In particular, the fabrication of the circuit and the method for translating a lower voltage to a higher voltage which is several multiples of the lower voltage uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a voltage level shifter circuit, which includes a first current mirror leg circuit and a second current mirror leg circuit, wherein:
    the first current mirror leg circuit receives an input signal on a low voltage power supply and level shifts the input signal to a high voltage power supply, which is at a greater voltage than the low voltage power supply;
    the high voltage power supply is output from the second current mirror leg circuit; and
    at least one of the first current mirror leg or the second current mirror leg includes a dual gate transistor.

2. The structure of claim 1, wherein the low voltage power supply is below a threshold of the dual gate transistor.

3. The structure of claim 1, wherein the high voltage power supply is a multiple voltage value of the low voltage power supply.

4. The structure of claim 3, wherein the high voltage power supply exceeds a reliability of a single gate, thin oxide, low voltage transistor.

5. The structure of claim 1, wherein:
the first current mirror leg circuit comprises a first NOR gate and a first transistor; and
the first NOR gate receives an inverted enable signal and an input signal and outputs a NETA signal.

6. A structure comprising a voltage level shifter circuit which includes a first current mirror leg circuit and a second current mirror leg circuit, wherein:
the first current mirror leg circuit receives an input signal on a low voltage power supply and level shifts the input signal to a high voltage power supply which is at a greater voltage than the low voltage power supply;
the high voltage power supply is output from the second current mirror leg circuit;
the first current mirror leg circuit comprises a first NOR gate and a first transistor;
the first NOR gate receives an inverted enable signal and an input signal and outputs a NETA signal; and
the first current mirror leg comprises a second transistor which is a dual gate, thick oxide, high voltage transistor and has a drain connected to a drain of the first transistor.

7. The structure of claim 6, wherein the first transistor is gated with a bias signal and is the dual gate, thick oxide, high voltage transistor.

8. The structure of claim 6, wherein:
the second current mirror leg circuit comprises a second NOR gate and a third transistor; and
the second NOR gate receives an inverted enable signal and an inverted input signal and outputs a NETB signal.

9. The structure of claim 8, wherein the second current mirror leg circuit comprises a fourth transistor which is a dual gate, thick oxide, high voltage transistor and has a drain connected to a drain of the third transistor.

10. The structure of claim 9, wherein the third transistor is gated with a bias signal and is the dual gate, thick oxide, high voltage transistor.

11. The structure of claim 10, wherein the third transistor is connected to an output signal terminal.

12. A circuit, comprising:
a first current mirror leg circuit comprising a first NOR gate and a first dual gate, thick oxide, high voltage transistor; and
a second current mirror leg circuit comprising a second NOR gate and a second dual gate, thick oxide, high voltage transistor.

13. The circuit of claim 12, further comprising a bias voltage generator and enable circuit, which receives an enable signal and generates an enable output signal and a bias signal.

14. The circuit of claim 13, wherein the bias voltage generator and enable circuit comprise a plurality of resistors and a plurality of transistors, which generate the enable output signal and the bias signal.

15. The circuit of claim 12, wherein the first NOR gate receives an inverted enable signal from a first inverter and an input signal and outputs a NETA signal.

16. The circuit of claim 12, wherein the second NOR gate receives an inverted enable signal from a first inverter and an inverted input signal from a second inverter and outputs a NETB signal.

17. A method, comprising:
receiving an input signal, a bias signal, a bias voltage generator output signal, an inverted input signal, and an inverted enable signal at a voltage level shifter circuit, wherein the voltage level shifter circuit includes a first current mirror leg circuit and a second current mirror leg circuit; and
level shifting the input signal to a higher voltage than the input signal by using a differential current between the first current mirror leg circuit and the second current mirror leg circuit,
wherein
the higher voltage is a multiple voltage value of the input signal, and
at least one of the first current mirror leg circuit or the second current mirror leg circuit includes a dual gate transistor.

18. The method of claim 17, further comprising reducing an output of the second current mirror leg circuit to a known output value in response to a power saving mode of operation being enabled.

19. The method of claim 17, further comprising, based on an enable signal, generating the bias voltage generator output signal and the bias signal.

20. The method of claim 17, further comprising generating the differential current between the first current mirror leg circuit and the second current mirror leg circuit based on the input signal and the inverted input signal.

21. A structure comprising a voltage level shifter circuit which includes a first current mirror leg circuit and a second current mirror leg circuit, wherein:
the first current mirror leg circuit receives an input signal on a low voltage power supply and level shifts the input signal to a high voltage power supply, which is at a greater voltage than the low voltage power supply;
the high voltage power supply is output from the second current mirror leg circuit;
the first current mirror leg circuit comprises a first transistor and a first NOR gate;
the second current mirror leg circuit comprises a second transistor and a second NOR gate;
the first transistor and the second transistor are gated with a bias signal;
the first NOR gate is connected to a source of the first transistor and receives the input signal;
the second NOR gate is connected to a source of the second transistor and receives an inverted version of the input signal;
an output of the first transistor is based on the bias signal and an output of the first NOR gate; and
an output of the second transistor is based on the bias signal and an output of the second NOR gate.

* * * * *